US009693477B1

(12) United States Patent
Ehlen (10) Patent No.: US 9,693,477 B1
(45) Date of Patent: Jun. 27, 2017

(54) CONTINUOUSLY POWERED SERVER SLED

(71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/172,982

(22) Filed: Jun. 3, 2016

(51) Int. Cl.
*H05K 7/16* (2006.01)
*H05K 7/14* (2006.01)
*H01R 41/00* (2006.01)

(52) U.S. Cl.
CPC .......... *H05K 7/1492* (2013.01); *H01R 41/00* (2013.01); *H05K 7/1489* (2013.01)

(58) Field of Classification Search
CPC ..... H05K 7/1492; H05K 7/1489; H01R 41/00
USPC ................................. 361/724–727
See application file for complete search history.

(56) References Cited

U.S. PATENT DOCUMENTS

| 4,017,770 | A | * | 4/1977 | Valfre | .................... | H01R 23/70 |
| | | | | | | 361/756 |
| 5,618,197 | A | * | 4/1997 | Bodahl-Johnsen | .. | H05K 7/1418 |
| | | | | | | 439/260 |
| 6,115,242 | A | | 9/2000 | Lambrecht | | |
| 6,209,979 | B1 | | 4/2001 | Fall et al. | | |
| 6,239,975 | B1 | * | 5/2001 | Otis | ......... | G06F 1/184 |
| | | | | | | 312/223.2 |
| 7,142,411 | B2 | * | 11/2006 | McLeod | ................. | G06F 1/182 |
| | | | | | | 174/50 |
| 7,661,966 | B2 | * | 2/2010 | Ohanesian | ........... | H01R 25/142 |
| | | | | | | 439/120 |
| 7,784,888 | B2 | * | 8/2010 | Oh | ......................... | A47B 51/00 |
| | | | | | | 312/223.6 |
| 8,109,652 | B2 | * | 2/2012 | Chen | .................... | F21V 19/0045 |
| | | | | | | 362/218 |
| 8,911,251 | B2 | | 12/2014 | Ehlen | | |
| 2013/0335913 | A1 | * | 12/2013 | Brashers | ................. | G06F 1/187 |
| | | | | | | 361/679.39 |
| 2014/0113473 | A1 | * | 4/2014 | Ehlen | .................... | H05K 7/1489 |
| | | | | | | 439/251 |
| 2014/0308828 | A1 | * | 10/2014 | Ehlen | ..................... | H01R 25/14 |
| | | | | | | 439/110 |

OTHER PUBLICATIONS

Non-Final Office Action mailed May 2, 2014, U.S. Appl. No. 13/655,343 by Ehlen, J., filed Oct. 18, 2012.

(Continued)

*Primary Examiner* — Nidhi Thaker
(74) *Attorney, Agent, or Firm* — Perkins Coie LLP (57) ABSTRACT

Technology is provided for a server platform with a continuously powered server sled. The server platform includes a cubby chassis including partitions defining a plurality of sled positions. A power tray is located in a corresponding one of the plurality of sled positions and a server sled is positioned on and continuously powered by the power tray. The power tray includes a tray chassis having a tray sidewall and a tray bottom wall. A pair of elongate conductors extend along the tray sidewall. A tray connector is mounted on the tray bottom wall and is in electrical communication with the pair of elongate conductors. The server sled includes a sled chassis having a chassis sidewall and a chassis bottom wall. A side-plane printed circuit board is mounted to the chassis sidewall and includes a pair of conductive elements positioned for sliding contact with the elongate conductors.

20 Claims, 9 Drawing Sheets

(56) References Cited

OTHER PUBLICATIONS

Notice of Allowance mailed Aug. 27, 2014 for U.S. Appl. No. 13/655,343 by Ehlen, J., filed Oct. 18, 2012.
Notice of Allowance mailed Jul. 13, 2016, for U.S. Appl. No. 14/314,746 by Ehlen, J., filed Jun. 25, 2014.
Notice of Allowance mailed Oct. 22, 2014 for U.S. Appl. No. 13/655,343 by Ehlen, J., filed Oct. 18, 2012.
U.S. Appl. No. 13/655,343 by Ehlen, J., filed Oct. 18, 2012.
U.S. Appl. No. 14/314,746 by Ehlen, J., filed Jun. 25, 2014.

* cited by examiner

CONTINUOUSLY POWERED SERVER SLED

TECHNICAL FIELD

This patent application generally relates to data storage server configurations, and more specifically, to a server tray assembly.

BACKGROUND

Many servers and other computer systems contain components mounted on sliding trays, which allow a user to easily access and replace the components without having to open the chassis of the computer system. Conventionally, a flexible power cable is connected to the rear of the sliding tray to provide power to components on the tray. The flexibility of the power cable allows the cable to remain connected when the tray is slid out of the chassis. However, the power cable must be at least as long as the desired travel length of the tray. Thus, if access to the entire length of the sliding tray is desired, the power cable must be at least as long as the length of the tray. This causes the power cable to occupy a considerable amount of space when the tray is fully inside the chassis, and the occupied space impedes airflow within the chassis, limiting cooling of the components within the chassis.

BRIEF DESCRIPTION OF THE DRAWINGS

Embodiments of the continuously powered server sled introduced herein may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A server platform with a continuously powered server sled is disclosed. The server platform includes a cubby chassis including one or more partitions defining a plurality of sled positions. At least one power tray is located in a corresponding one of the plurality of sled positions and a server sled is positioned on and continuously powered by the power tray. The power tray includes a tray chassis having a tray sidewall and a tray bottom wall. A pair of elongate conductors extend along the tray sidewall. A tray connector is mounted on the tray bottom wall and is in electrical communication with the pair of elongate conductors. The server sled includes a sled chassis having a chassis sidewall and a chassis bottom wall. A vertically oriented side-plane printed circuit board (PCB) is mounted to the chassis sidewall and a pair of conductive elements are mounted on the PCB and are positioned for sliding contact with the pair of elongate conductors.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 1:
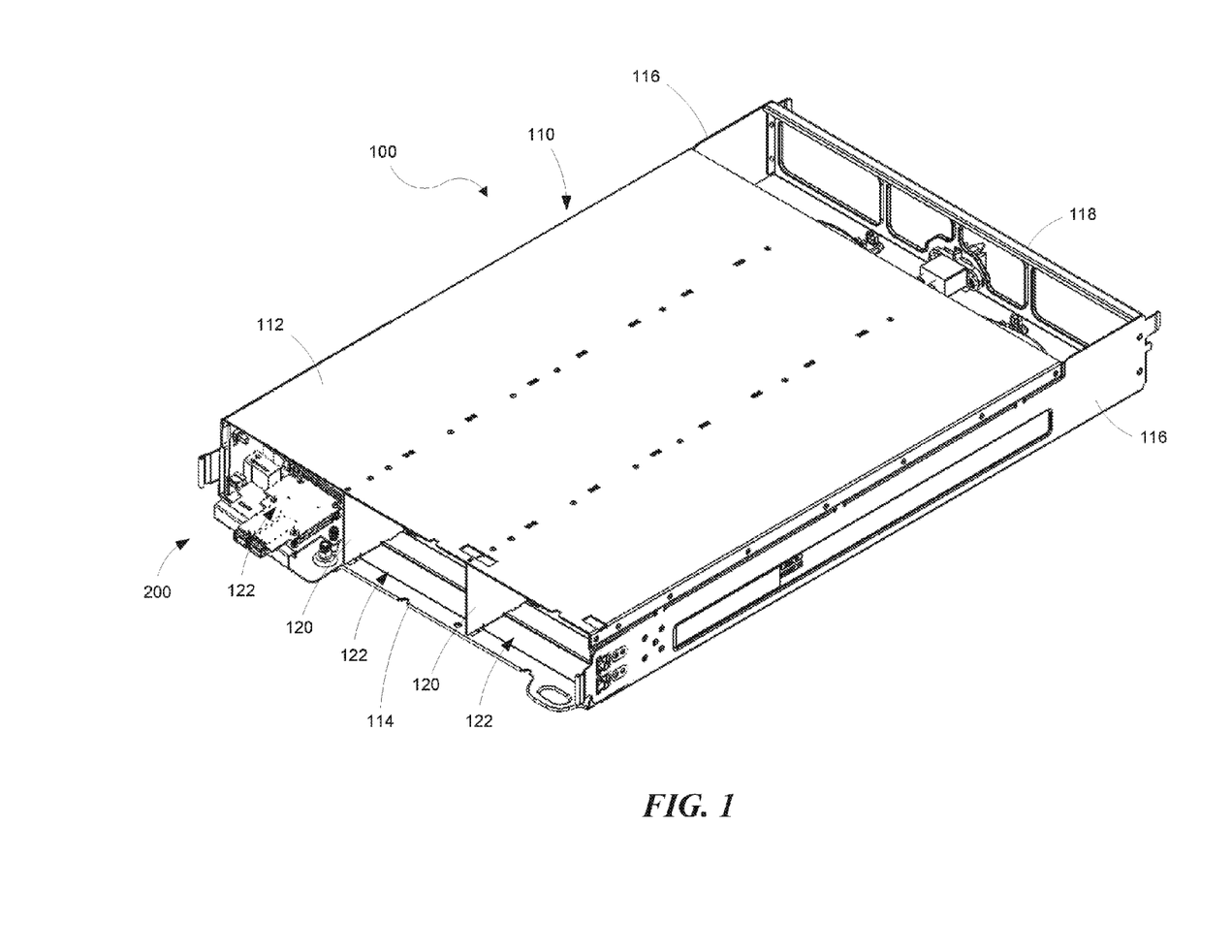
FIG. 1 is an isometric view of a device platform with a cubby chassis according to a representative embodiment.

As shown in FIG. 1, the device (e.g., server and/or memory) platform 100 includes a cubby chassis 110 configured to mount into a component rack (not shown) and house one or more device sleds 200. The illustrated cubby chassis 110 can be a sheet metal chassis, and it includes three sled positions 122 sized and configured to receive a device sled 200 in each position. The cubby chassis 110 of other embodiments can have a greater or fewer number of sled positions 122. The cubby chassis 110 includes top and bottom panels 112 and 114, respectively, spaced apart by sidewalls 116, and end wall 118. A pair of partitions 120 are positioned between the top and bottom panels (112, 114) to divide the cubby chassis 110 into the three sled positions 122.

Figure 2:
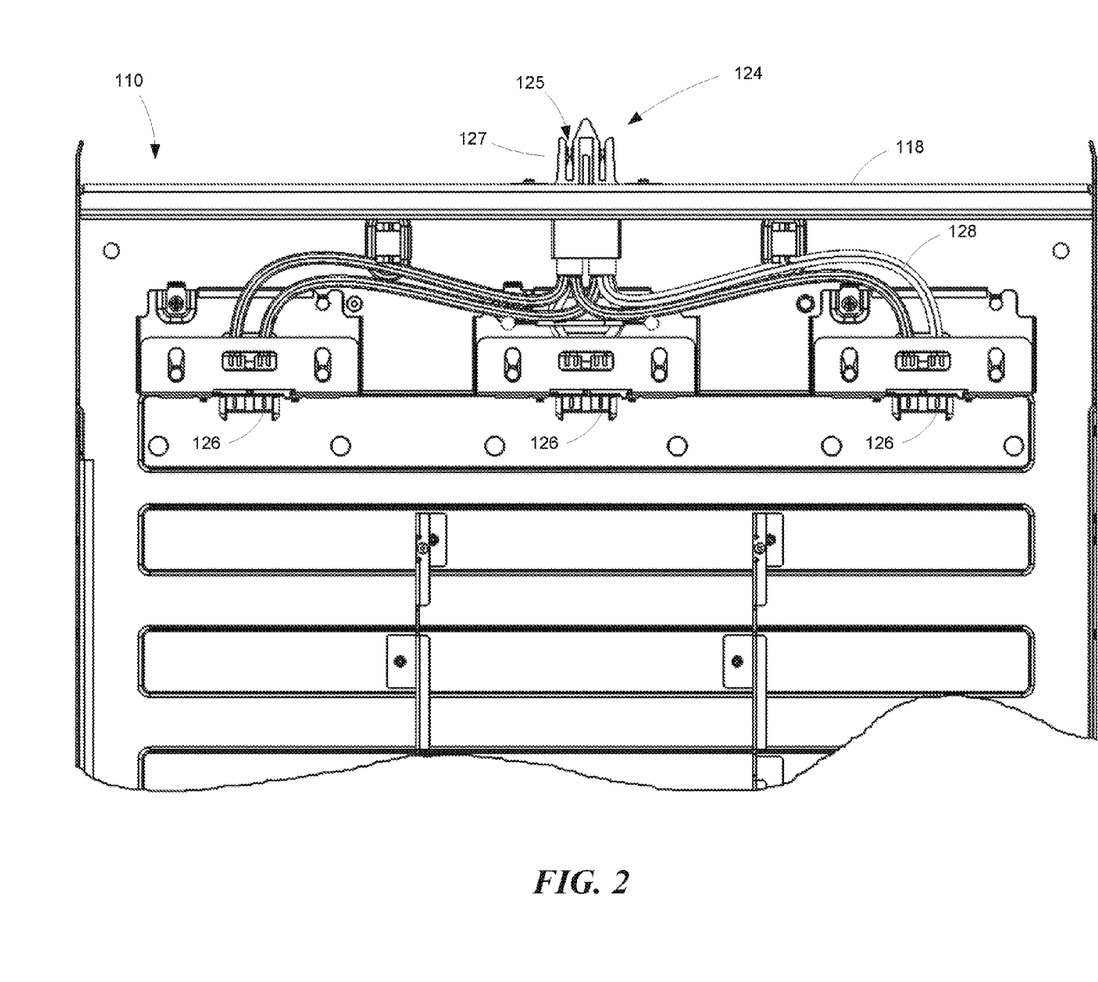
FIG. 2 is a partial, enlarged top plan view of the cubby chassis shown in FIG. 1 with the top panel removed for clarity.

With further reference to FIG. 2, the cubby chassis 110 includes a power input connector 124 attached to the end wall 118 of the cubby chassis 110. In some embodiments, the power input connector 124 includes a pair of slots 125 containing contacts 127 that engage or clip onto a corresponding power bus bar (not shown). The power input connector 124 is connected to three cubby connectors 126 via a power cable assembly 128.

Figure 3:
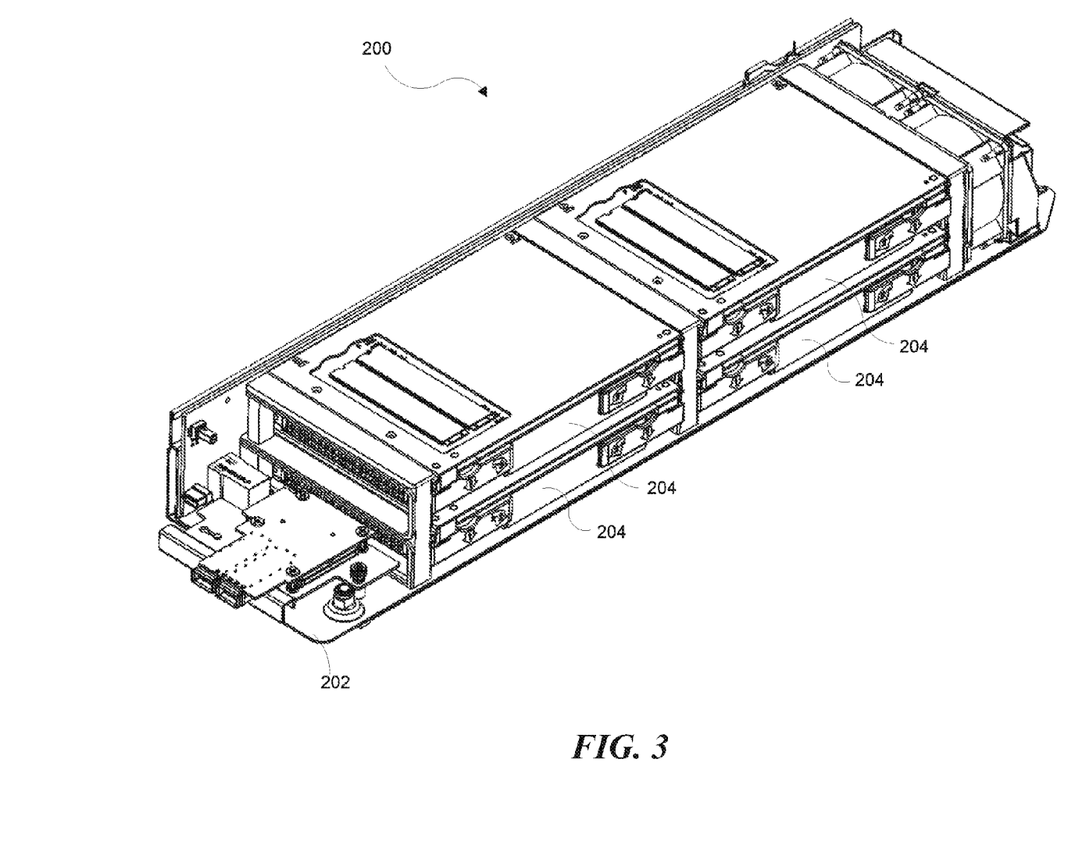
FIG. 3 is an isometric view of the device sled shown in FIG. 1.

As shown in FIG. 3, the illustrated device sled 200 includes a sled chassis 202 and contains four server cards 204. Although the embodiments are described with respect to servers, other computer devices, such as memory and graphics processing units, etc., can be used or contained in the device's sled.

Figure 4:
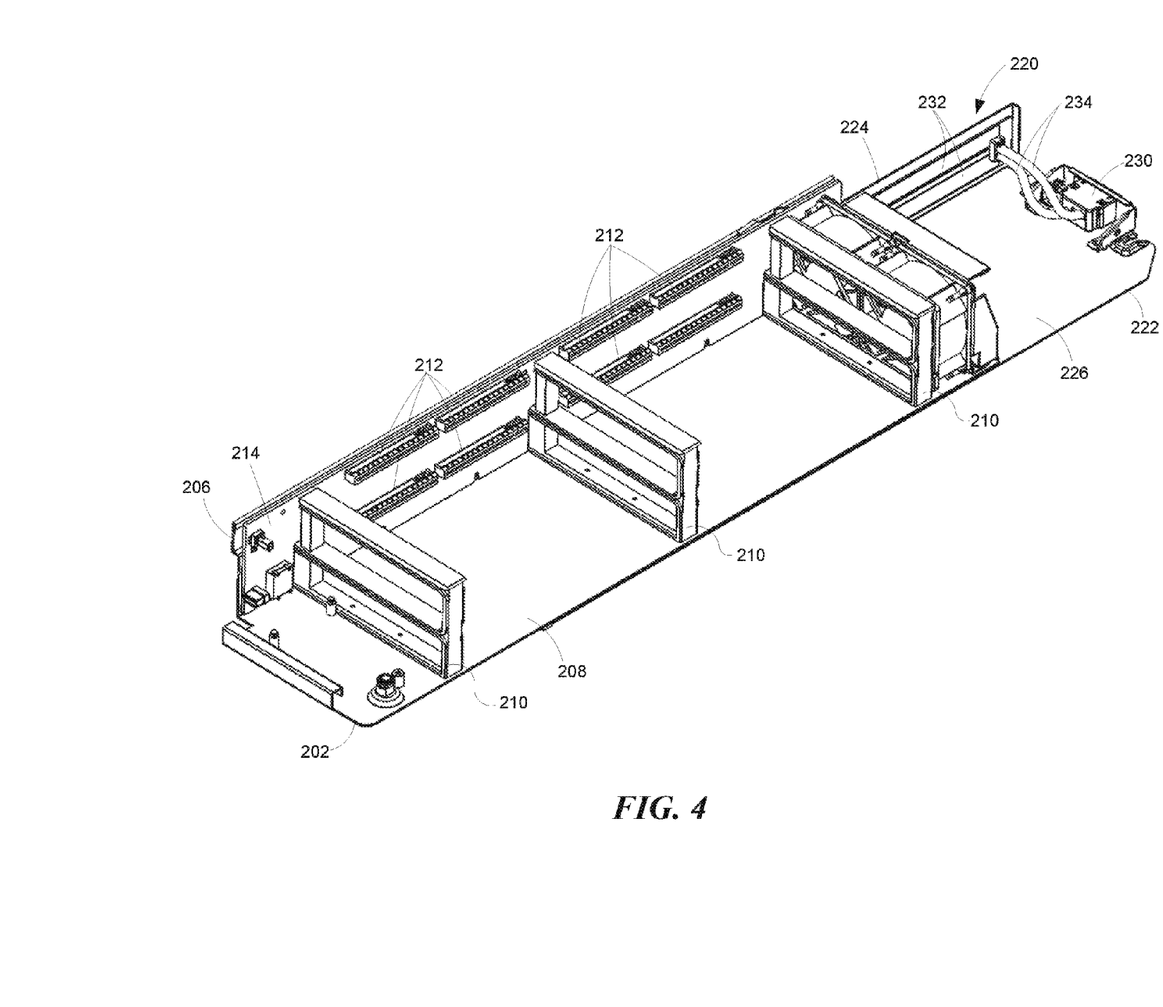
FIG. 4 is an isometric view illustrating the sled chassis positioned on the power tray.

As shown in FIG. 4, the sled chassis 202 is movably positioned on the power tray 220 and is slideable along the power tray. The power tray 220 can be operatively installed in one of the sled positions 122 (FIG. 1), and the power tray 220 has a tray connector 230 that removably plugs onto a corresponding one of the cubby connectors 126 (FIG. 2). The tray connector 230 is electrically connected to a pair of elongate conductors 232 with a cable assembly 234. Accordingly, the power tray 220 supplies power to the sled chassis 202 via the elongate conductors 232. The power tray 220 includes a tray chassis 222 having a tray side wall 224 and a tray bottom wall 226. Tray connector 230 is mounted on the tray bottom wall 226 and the elongate conductors 232 extend along the side wall 224 of the tray chassis 222. The sled chassis 202 includes a side wall 206 and a bottom wall 208 supporting a plurality of dividers 210 that can support and align the servers 204 (FIG. 3) with corresponding connectors 212. The connectors 212 are connected to a vertically oriented panel, such as a side-plane PCB 214, mounted to the chassis sidewall 206.

Figure 5:
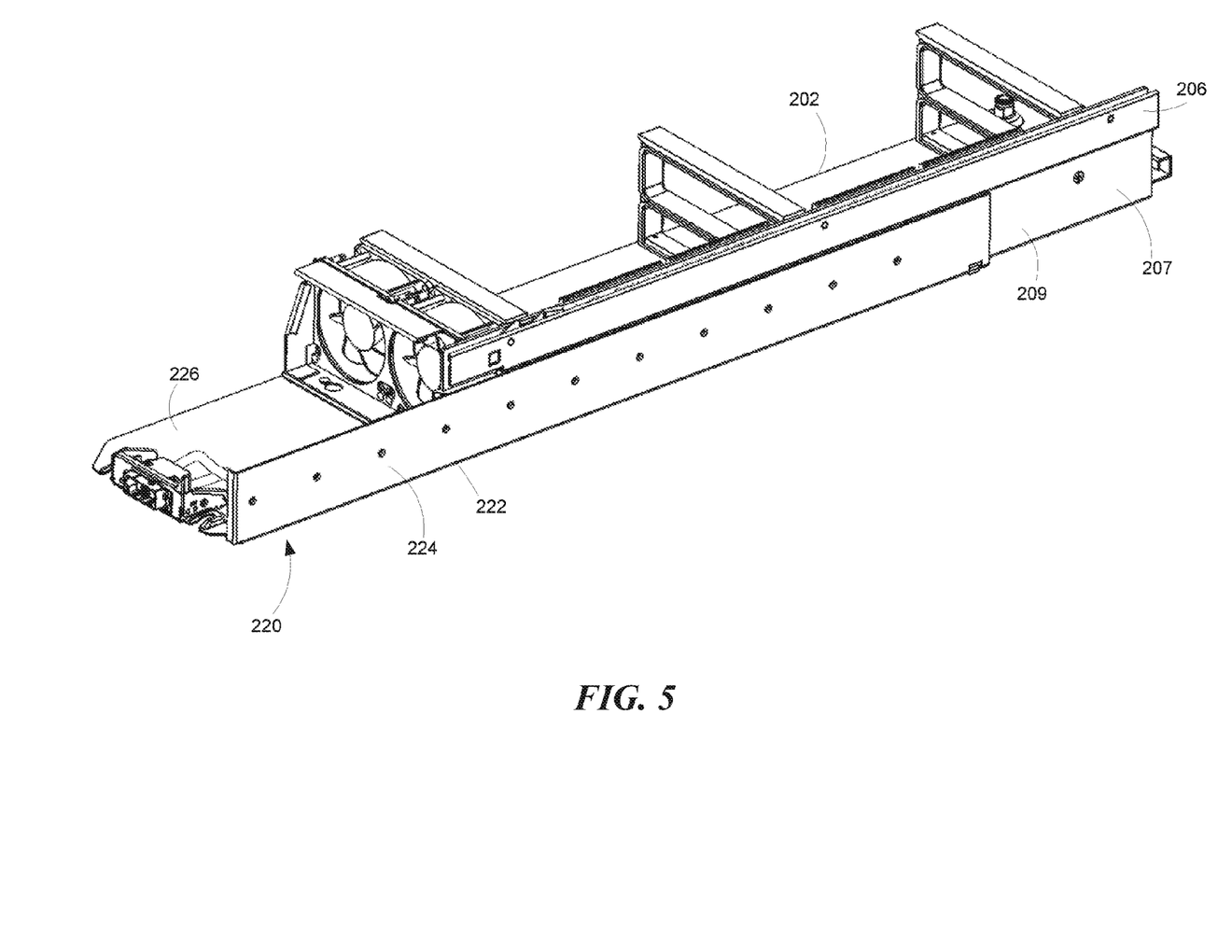
FIG. 5 is an isometric view similar to FIG. 4 as viewed from the opposite side.

As shown in FIG. 5, the sled chassis side wall 206 includes a recessed region 207 configured to receive the side wall 224 of the tray chassis 222. In some embodiments, a plastic or Mylar sheet 209 is positioned on the recessed region 207 to prevent the elongate conductors from shorting against the side wall 206.

Figure 6:
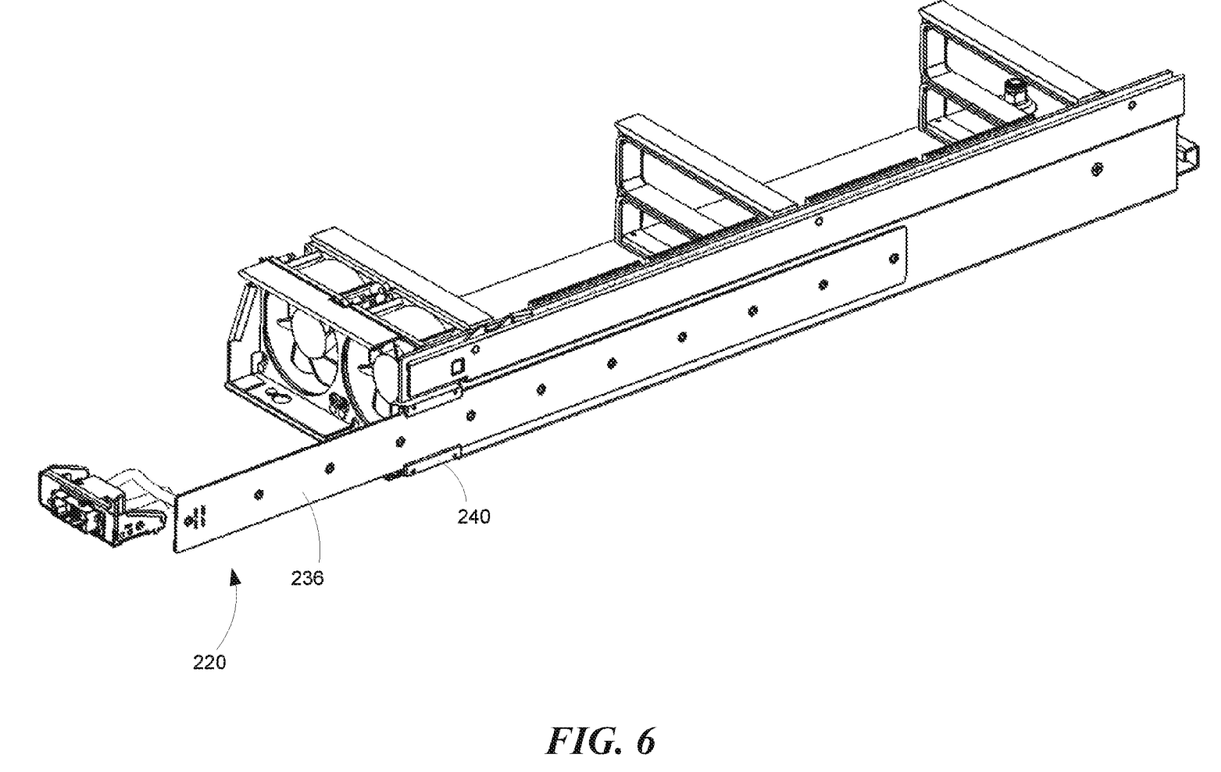
FIG. 6 is an isometric view similar to FIG. 5 with the power tray chassis removed for clarity.
Figure 7:
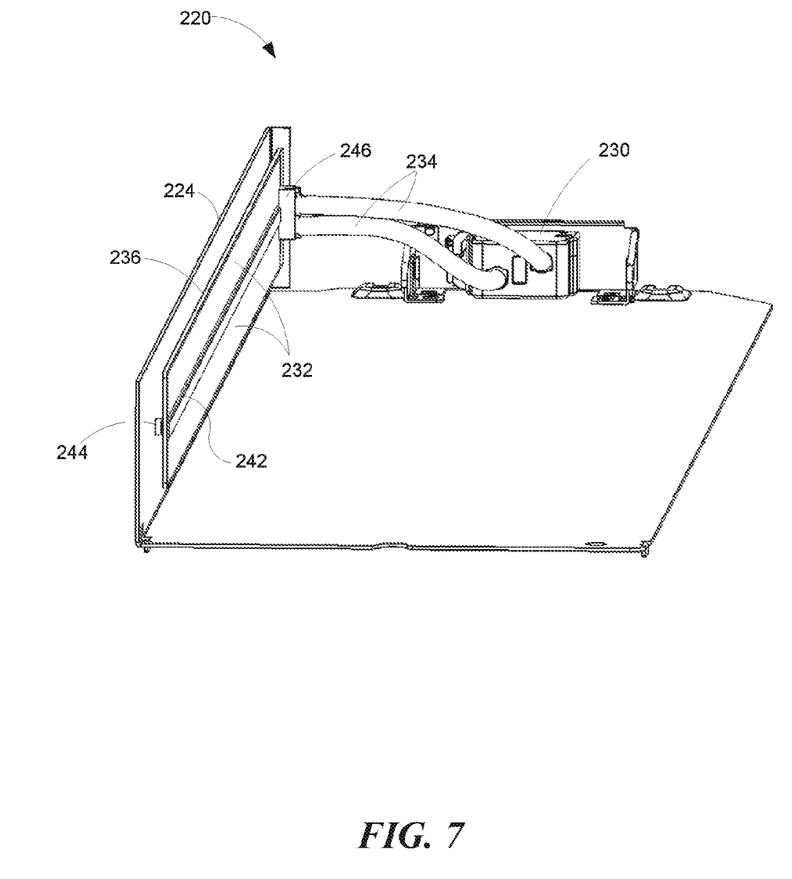
FIG. 7 is an isometric view of the power tray.

As shown in FIG. 6, the power tray 220 includes an elongate conductor support, such as a conductor PCB 236, that is slideable within a conductor guide 240. With further reference to FIG. 7, the conductor PCB 236 is spaced apart from the side wall 224 with a plurality of spacers 244 to provide clearance for the conductor guide 240. In some embodiments, the elongate conductors 232 are spaced apart by a plastic or Mylar strip 242 to prevent shorting between the elongate conductors 232. In some embodiments, the power cables 234 are attached to the elongate conductors 232 via a connector 246.

Figure 8:
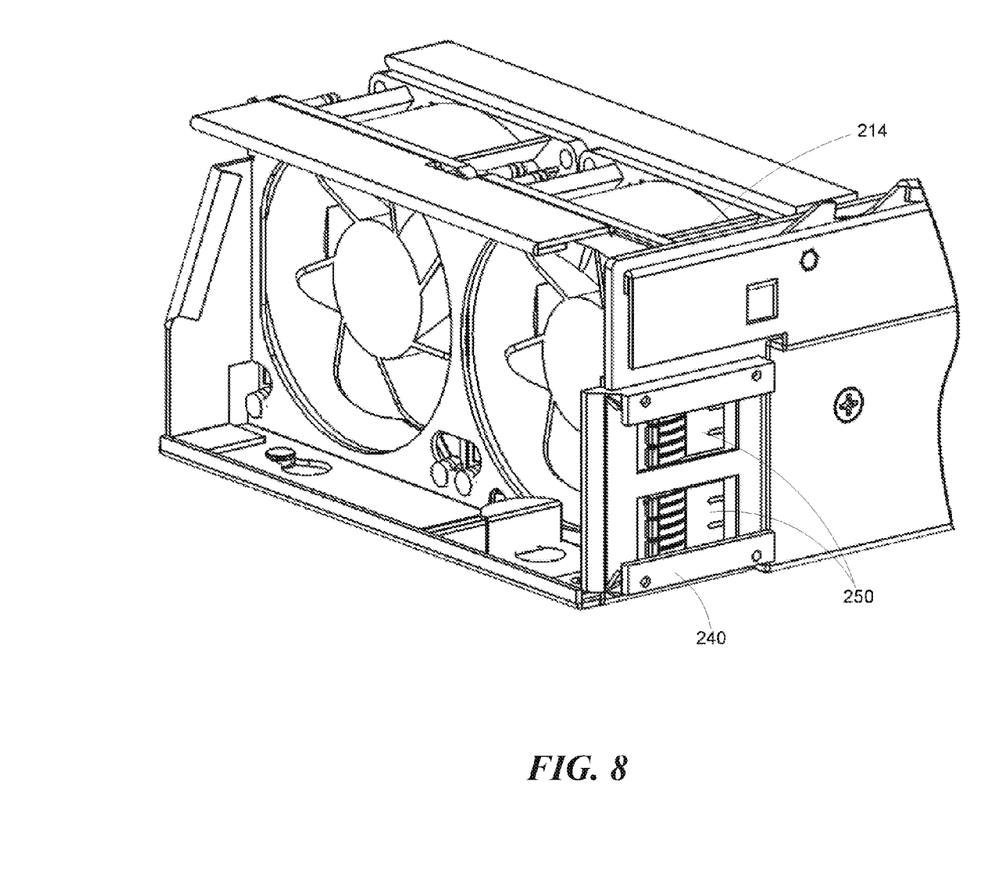
FIG. 8 is a partial isometric view of the device sled.
Figure 9:
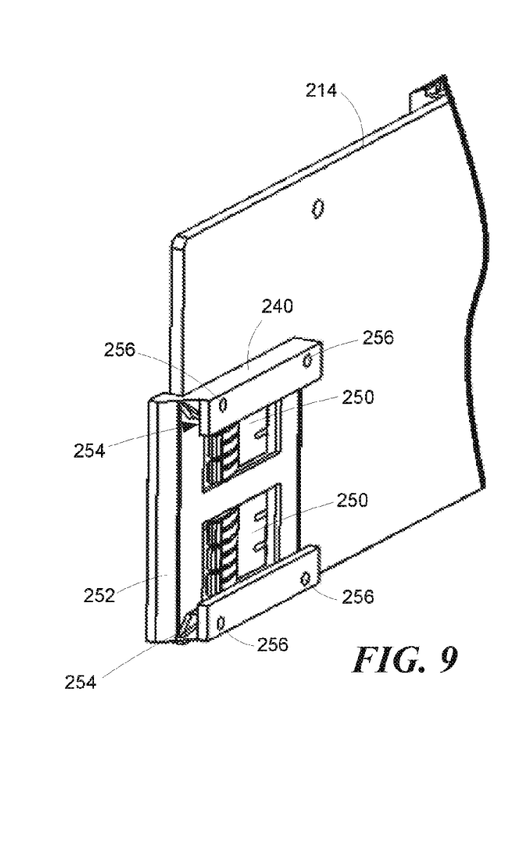
FIG. 9 is a partial isometric view of the side-plane printed circuit board and conductive elements.
Figure 10:
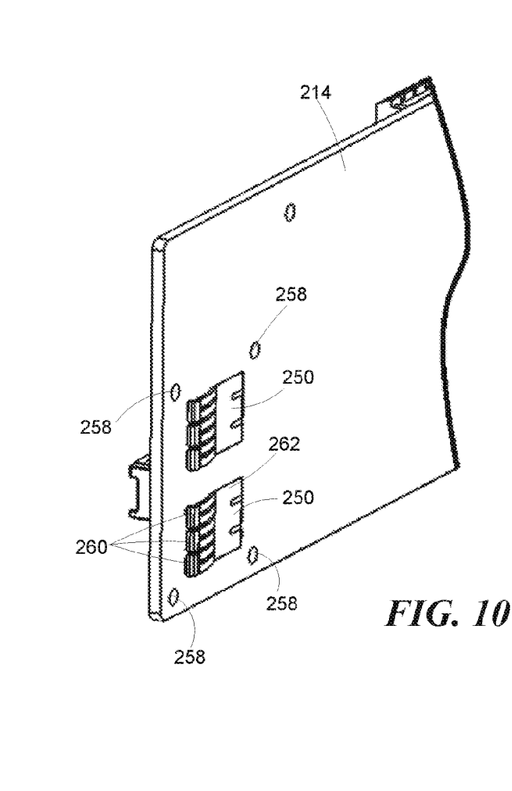
FIG. 10 is similar to FIG. 9 with the conductor guide removed for clarity.

As shown in FIG. 8, a pair of conductive elements 250 are mounted on the side-plane PCB 214 for sliding contact with the pair of elongate conductors 232 (FIG. 7) on the sidewall 224 of the tray chassis 222. In some embodiments, the conductive elements 250 are spring biased toward the pair of elongate conductors 232. The conductor guide 240 is mounted to the side-plane PCB 214 and surrounds the conductive elements 250. As shown in FIGS. 9 and 10, the conductor guide 240 includes a pair of opposed grooves 254 adapted to slideably receive the conductor PCB 236 (FIG. 7). The conductor guide 240 also includes a ramped edge 252 to facilitate initial engagement of the conductor guide 240 with the conductor PCB 236 (FIG. 7). The conductor guide 240 is mounted to PCB 214 with suitable fasteners (not shown) extending through apertures 256 to engage apertures 258 on PCB 214. As shown in FIG. 10, the conductive elements 250 include a surface mount portion 262 with a plurality of fingers 260 extending therefrom. Conductor elements 250 can be surface mounted (e.g., soldered) to the PCB 214.

The sled chassis 202 slides along the power tray 220 between stowed (e.g., FIGS. 1 and 3) and extended positions (e.g., FIGS. 4 and 5) with constant contact between the conductor elements 250 and the elongate conductors 232 to provide continuous power as the sever sled 200 moves between the stowed and extended positions. The illustrated embodiment has the elongate conductors 232 on the power tray 220, and the conductor elements 250 are on the sled 200. In some embodiments, an inverse configuration can be used (i.e., elongate conductors 232 on the sled 200, and the conductor elements 250 on the power tray 220).

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A device platform, comprising:
    a chassis including a sled position;
    a power tray located in the sled position, the power tray comprising:
        a tray chassis having a tray sidewall and a tray bottom wall;
        a pair of elongate conductors extending along the tray chassis; and
        a tray connector mounted on the tray chassis and in electrical communication with the pair of elongate conductors; and
    a device sled positioned on the power tray, the device sled comprising:
        a sled chassis having a chassis sidewall and a chassis bottom wall;

a chassis panel mounted to the sled chassis; and
a pair of conductive elements mounted on the chassis panel and positioned for sliding contact with the pair of elongate conductors.

2. The device platform of claim 1, wherein the chassis has a power input connector configured to receive power from a component rack, and the chassis includes at least one connector corresponding to the sled position connected to the power connector, and wherein the tray connector is mated with the at least one connector.

3. The device platform of claim 1, wherein the pair of elongate conductors are disposed on a conductor support.

4. The device platform of claim 3, wherein the conductor support is spaced apart from the tray chassis.

5. The device platform of claim 4, further comprising a conductor guide mounted to the chassis panel adjacent to the pair of conductive elements.

6. The device platform of claim 5, wherein the conductor guide includes a pair of opposed grooves adapted to slideably receive the conductor support.

7. The device platform of claim 1, wherein the pair of conductive elements are spring biased toward the pair of elongate conductors.

8. The device platform of claim 7, wherein the pair of conductive elements each includes one or more fingers.

9. A server platform, comprising:
a cubby chassis including one or more partitions defining a plurality of sled positions;
a power tray located in a corresponding one of the plurality of sled positions, the power tray comprising:
a tray chassis having a tray sidewall and a tray bottom wall;
a pair of elongate conductors extending along the tray sidewall; and
a tray connector mounted on the tray chassis and in electrical communication with the pair of elongate conductors; and
a server sled movably positioned on the power tray and movable relative to the power tray between stowed and extended positions, the server sled comprising:
a sled chassis having a chassis sidewall and a chassis bottom wall adjacent to the tray sidewall and tray bottom wall, respectively;
a vertically oriented side-plane mounted to the chassis sidewall; and
a pair of conductive elements connected to the side-plane and positioned for sliding contact with the pair of elongate conductors, wherein the pair of conductive elements are in continuous electrical contact with the pair of elongate conductors when the server sled is in and moves between the stowed and extended positions.

10. The server platform of claim 9, wherein the cubby chassis has a power input connector configured to receive power from a component rack, and the cubby chassis has a plurality of cubby connectors corresponding to each of the plurality of sled positions connected to the power connector, and wherein the tray connector is mated with a corresponding one of the plurality of cubby connectors.

11. The server platform of claim 9, wherein the pair of elongate conductors are disposed on a conductor PCB.

12. The server platform of claim 11, wherein the conductor PCB is spaced apart from the tray sidewall.

13. The server platform of claim 12, further comprising a conductor guide mounted to the side-plane and surrounding the pair of conductive elements.

14. The server platform of claim 13, wherein the conductor guide includes a pair of opposed grooves adapted to slideably receive the conductor PCB.

15. The server platform of claim 9, wherein the pair of conductive elements are spring biased toward the pair of elongate conductors.

16. The server platform of claim 15, wherein the pair of conductive elements each includes one or more fingers.

17. A server platform, comprising:
a cubby chassis including one or more partitions defining a plurality of sled positions;
at least one power tray located in a corresponding one of the plurality of sled positions, the power tray comprising:
a tray chassis having a tray sidewall and a tray bottom wall;
a pair of elongate conductors disposed on a conductor printed circuit board (PCB) extending along and space apart from the tray sidewall; and
a tray connector mounted on the tray bottom wall and in electrical communication with the pair of elongate conductors; and
a server sled positioned on the at least one power tray, the server sled comprising:
a sled chassis having a chassis sidewall and a chassis bottom wall;
a vertically oriented side-plane printed circuit board (PCB) mounted to the chassis sidewall;
a pair of conductive elements mounted on the PCB and positioned for sliding contact with the pair of elongate conductors; and
a conductor guide mounted to the side-plane PCB and surrounding the pair of conductive elements, wherein the conductor guide includes a pair of opposed grooves adapted to slideably receive the conductor PCB.

18. The server platform of claim 17, further comprising an insulator strip positioned between the pair of elongate conductors.

19. The server platform of claim 17, wherein the pair of conductive elements are spring biased toward the pair of elongate conductors.

20. The server platform of claim 19, wherein the pair of conductive elements each includes one or more fingers.

* * * * *